(12) United States Patent
Tatani et al.

(10) Patent No.: US 7,217,961 B2
(45) Date of Patent: May 15, 2007

(54) SOLID-STATE IMAGE PICKUP DEVICE AND METHOD FOR PRODUCING THE SAME

(75) Inventors: Keiji Tatani, Kanagawa (JP); Hideshi Abe, Kanagawa (JP); Masanori Ohashi, Nagasaki (JP); Atsushi Masagaki, Kanagawa (JP); Atsuhiko Yamamoto, Kanagawa (JP); Masakazu Furukawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/340,180

(22) Filed: Jan. 26, 2006

(65) Prior Publication Data

US 2006/0169978 A1    Aug. 3, 2006

(30) Foreign Application Priority Data

Feb. 1, 2005    (JP)    ............................. 2005-024761

(51) Int. Cl.
*H01L 31/0328* (2006.01)
(52) U.S. Cl. ...................... 257/187; 257/184; 257/192; 257/222; 257/291
(58) Field of Classification Search ..................... None
See application file for complete search history.

(56) References Cited

U.S. PATENT DOCUMENTS 5,252,851 A * 10/1993 Mita et al. .................. 257/446
6,211,509 B1 * 4/2001 Inoue et al. ............. 250/208.1

* cited by examiner

*Primary Examiner*—Wai-Sing Louie
(74) *Attorney, Agent, or Firm*—Robert J. Depke; Rockey, Depke, Lyons & Kitzinger LLC.

(57) ABSTRACT

A solid-state image pickup device includes an element isolation insulating film electrically isolating pixels on the surface of a well region; a first isolation diffusion layer electrically isolating the pixels under the element isolation insulating film; and a second isolation diffusion layer electrically isolating the pixels under the first isolation diffusion layer, wherein a charge accumulation region is disposed in the well region surrounded by the first and second isolation diffusion layers, the inner peripheral part of the first isolation diffusion layer forms a projecting region, an impurity having a conductivity type of the first isolation diffusion layer and an impurity having a conductivity type of the charge accumulation region are mixed in the projecting region, and a part of the charge accumulation region between the charge accumulation region and the second isolation diffusion layer is abutted or close to the second isolation diffusion layer under the projecting region.

3 Claims, 7 Drawing Sheets

SOLID-STATE IMAGE PICKUP DEVICE AND METHOD FOR PRODUCING THE SAME

CROSS REFERENCES TO RELATED APPLICATIONS

The present invention contains subject matter related to Japanese Patent Application JP 2005-024761 filed in the Japanese Patent Office on Feb. 1, 2005, the entire contents of which are incorporated herein by reference.

BACKGROUND OF THE INVENTION

1. Field of the Invention

The present invention relates to a solid-state image pickup device that can improve the photoelectric conversion efficiency of a unit pixel and a method for producing the same.

2. Description of the Related Art

A complementary metal oxide semiconductor (CMOS) type solid-state image pickup device, which is one type of image sensor, includes a pixel area and peripheral circuits that drive the pixel area and process signals. Miniaturization technologies for the peripheral circuits have been generally applied to the pixel area. In addition, in the element-isolation of a pixel of the recent fine CMOS type solid-state image pickup device, a method of shallow trench isolation (STI) has been used as in the case of the peripheral circuits.

Figure 7:
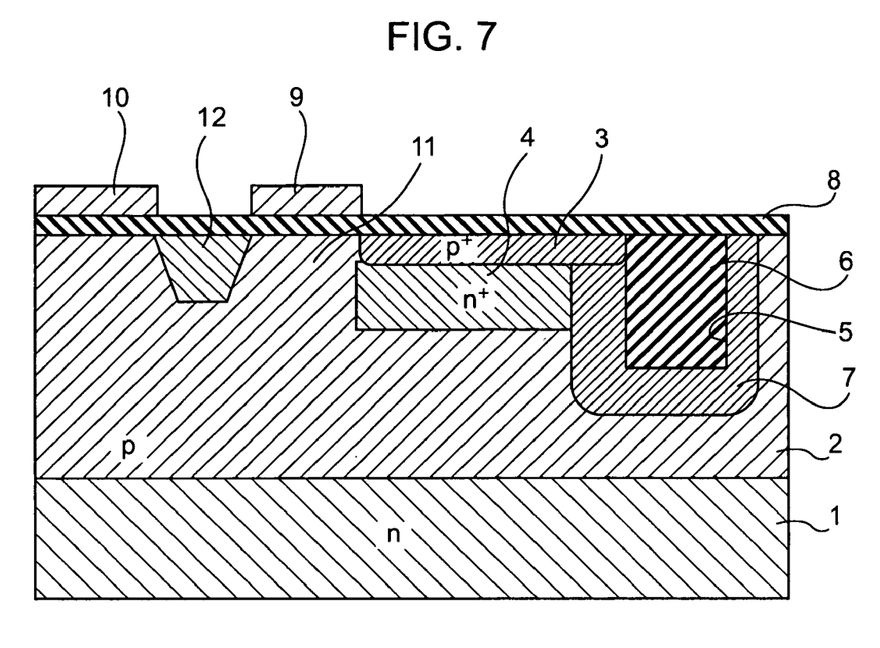
FIG. 7 is a cross-sectional view showing the schematic structure of a known general CMOS image sensor.

FIG. 7 is a cross-sectional view showing a schematic structure of a known general CMOS image sensor.

In FIG. 7, the CMOS image sensor includes an n-type silicon semiconductor substrate 1; a p-type semiconductor well region 2 disposed on the n-type silicon semiconductor substrate 1; a $p^+$-type hole accumulation layer 3, an n-type signal charge accumulation region 4, a reading region 11, an $n^+$-type reading part (FD) 12, and a trench 5 for shallow trench isolation (STI), which are disposed in the p-type semiconductor well region 2. An insulating material 6 such as silicon oxide is embedded in the trench 5 and a $P^+$-type STI side wall layer 7 is disposed outside of the insulating material 6. A reading gate 9 is disposed above the reading region 11 with an insulating film 8 disposed therebetween. A reset gate 10 is disposed adjacent to the reading gate 9. A light-receiving part of such a CMOS image sensor is composed of an embedded photodiode including the hole accumulation layer 3 provided on the top face of the substrate and the signal charge accumulation region 4 provided under the hole accumulation layer 3 (refer to Japanese Unexamined Patent Application Publication No. 2002-231929).

SUMMARY OF THE INVENTION

In the CMOS image sensor shown in FIG. 7, from the viewpoint of suppressing the generation of dark current, the STI side wall layer 7 has at least a certain width (thickness), in other words, has at least a certain concentration. However, when the STI side wall layer 7 has a certain width or more, the effective area of the signal charge accumulation region 4 of the photodiode is decreased, resulting in a decrease in the amount of electric charge to be handled. Consequently, in order to increase the amount of electric charge, i.e., the amount of saturation signal (the amount of signal charge) handled by the photodiode per unit area, a method of increasing not only the impurity concentration of the $n^+$ layer of the signal charge accumulation region 4 but also the impurity concentration of the surface $p^+$ layer and that of the p layer of the well region 2 disposed under the signal charge accumulation region 4 is employed.

However, in the solid-state image pickup device having such a structure, the electric field between the $n^+$ layer of the signal charge accumulation region 4 and the surface $p^+$ layer easily increases. The increase in the electric field disadvantageously increases dark current and white spots. Also, in order to increase the amount of electric charge handled by the photodiode per unit area, when the impurity concentration of the $n^+$ layer of the signal charge accumulation region 4 is increased, the electric field with the hole accumulation layer 3 is increased, thereby easily generating white spots.

The present invention has been made in view of these situations, and it is desirable to provide a solid-state image pickup device in which the photoelectric conversion efficiency of a unit pixel can be improved and characteristics relating to problems such as white spots can be improved and a method for producing the same.

According to an embodiment of the present invention, there is provided a solid-state image pickup device in which a plurality of pixels including a photoelectric conversion part having a charge accumulation region accumulating signal charges is two-dimensionally arrayed in a well region provided on a semiconductor substrate, the solid-state image pickup device including an element isolation insulating film that electrically isolates the pixels on the surface of the well region; a first isolation diffusion layer that electrically isolates the pixels under the element isolation insulating film; and a second isolation diffusion layer that electrically isolates the pixels under the first isolation diffusion layer, wherein the charge accumulation region is disposed in the well region surrounded by the first isolation diffusion layer and the second isolation diffusion layer, the inner peripheral part of the first isolation diffusion layer corresponding to the boundary between the charge accumulation region and the first isolation diffusion layer forms a projecting region projecting in the charge accumulation region, an impurity having a conductivity type of the first isolation diffusion layer and an impurity having a conductivity type of the charge accumulation region are mixed in the projecting region, and a part of the charge accumulation region corresponding to the boundary between the charge accumulation region and the second isolation diffusion layer is disposed under the projecting region and is abutted or disposed close to the second isolation diffusion layer.

According to an embodiment of the present invention, there is provided a method for producing a solid-state image pickup device in which a plurality of pixels including a photoelectric conversion part having a charge accumulation region accumulating signal charges is two-dimensionally arrayed in a well region formed on a semiconductor substrate, the method including the steps of forming an element isolation insulating film on the surface of the well region, the element isolation insulating film electrically isolating the pixels; forming a first isolation diffusion layer in the well region, the first isolation diffusion layer electrically isolating the pixels under the element isolation insulating film and having a projecting region in which the inner peripheral part of the first isolation diffusion layer corresponding to the boundary with the charge accumulation region projects in the charge accumulation region; forming a second isolation diffusion layer in the well region, the second isolation diffusion layer electrically isolating the pixels under the first isolation diffusion layer; and forming the photoelectric conversion part for each pixel in the well region in which the photoelectric conversion part is electrically isolated from each other by the element isolation insulating film, the first isolation diffusion layer, and the second isolation diffusion layer, wherein the step of forming the photoelectric conversion part includes the steps of implanting an impurity ion for forming the charge accumulation region in the well region surrounded by the first isolation diffusion layer and the second isolation diffusion layer and the projecting region of the first isolation diffusion layer; and thermally diffusing the impurity implanted in the well region by the step of ion implantation so that a part of the charge accumulation region corresponding to the boundary between the charge accumulation region and the second isolation diffusion layer is disposed under the projecting region and is abutted or disposed close to the second isolation diffusion layer.

According to an embodiment of the present invention, there is provided a method for producing a solid-state image pickup device in which a plurality of pixels including a photoelectric conversion part having a charge accumulation region accumulating signal charges is two-dimensionally arrayed in a well region formed on a semiconductor substrate, the method including the steps of forming an element isolation insulating film on the surface of the well region, the element isolation insulating film electrically isolating the pixels; forming a first isolation diffusion layer in the well region, the first isolation diffusion layer electrically isolating the pixels under the element isolation insulating film and having a projecting region in which the inner peripheral part of the first isolation diffusion layer corresponding to the boundary with the charge accumulation region projects in the charge accumulation region; forming a second isolation diffusion layer in the well region, the second isolation diffusion layer electrically isolating the pixels under the first isolation diffusion layer; and forming the photoelectric conversion part for each pixel in the well region in which the photoelectric conversion part is electrically isolated from each other by the element isolation insulating film, the first isolation diffusion layer, and the second isolation diffusion layer, wherein the step of forming the photoelectric conversion part includes the steps of implanting an impurity ion for forming the charge accumulation region in the well region surrounded by the first isolation diffusion layer and the second isolation diffusion layer; and thermally diffusing the impurity implanted in the well region by the step of ion implantation so that a part of the charge accumulation region corresponding to the boundary between the charge accumulation region and the second isolation diffusion layer is disposed under the projecting region and is abutted or disposed close to the second isolation diffusion layer, and the projecting region of the first isolation diffusion layer is formed in a state in which an impurity having the conductivity type of the first isolation diffusion layer and an impurity having a conductivity type of the charge accumulation region are mixed.

DESCRIPTION OF THE PREFERRED EMBODIMENTS

According to a solid-state image pickup device of an embodiment of the present invention, the inner peripheral part of a first isolation diffusion layer corresponding to the boundary between a charge accumulation region and the first isolation diffusion layer forms a projecting region projecting in the charge accumulation region, a part of the charge accumulation region corresponding to the boundary between the charge accumulation region of a photoelectric conversion part and a second isolation diffusion layer is disposed under the projecting region and is abutted or disposed close to the second isolation diffusion layer, and the projecting region is formed in a state in which an impurity having a conductivity type of the first isolation diffusion layer and an impurity having a conductivity type of the charge accumulation region are mixed.

This structure can increase the charge accumulation region (area) of the photoelectric conversion part in a pixel to improve the photoelectric conversion efficiency of a unit pixel.

First Embodiment

A solid-state image pickup device according to an embodiment of the present invention and a method for producing the same will now be described with reference to the drawings.

Figure 1:
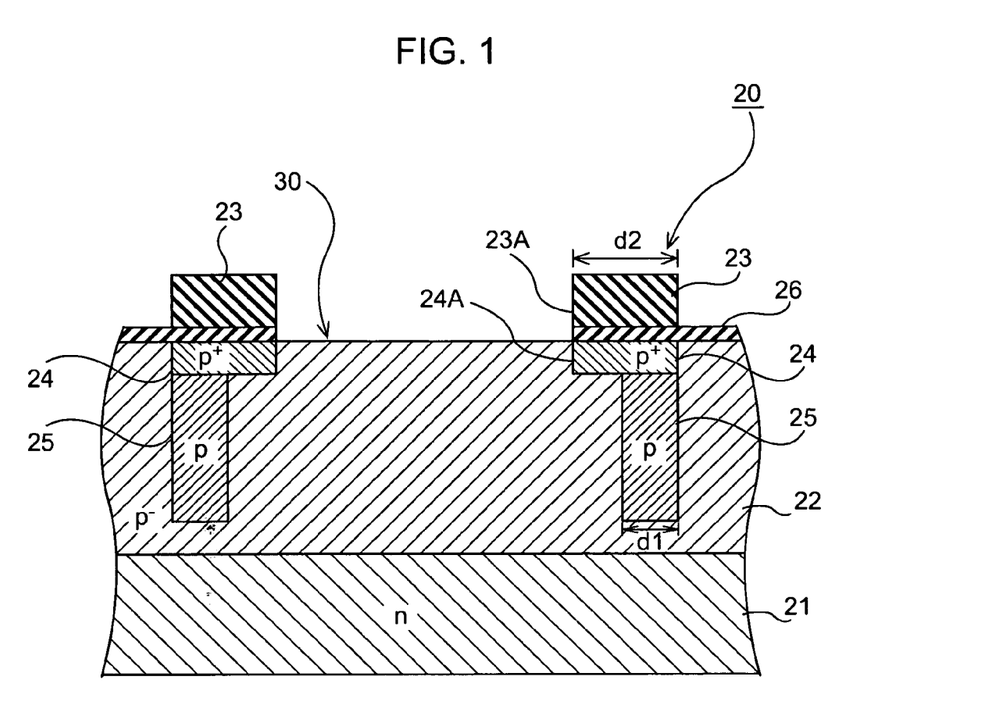
FIG. 1 is a view showing the structure of the relevant part in a process for producing a solid-state image pickup device according to a first embodiment of the present invention.
Figure 2:
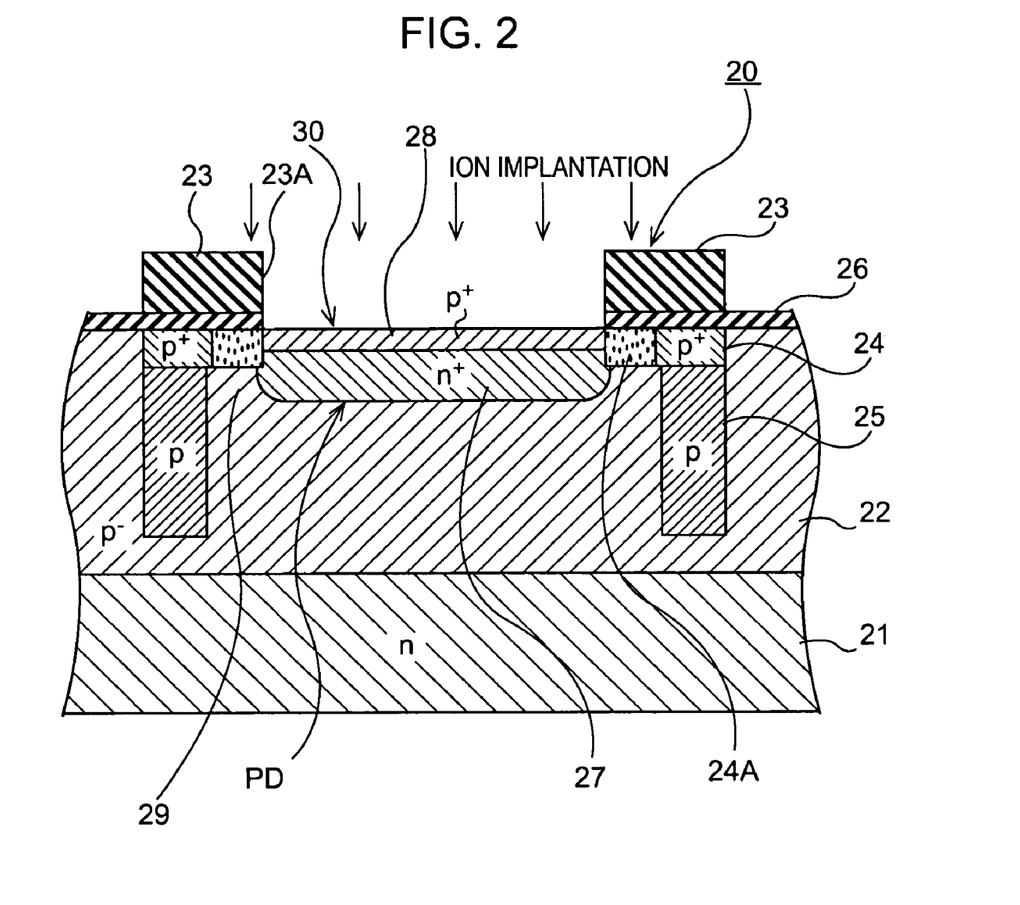
FIG. 2 is a view showing the structure of the relevant part in the process for producing the solid-state image pickup device according to the first embodiment of the present invention.
Figure 3:
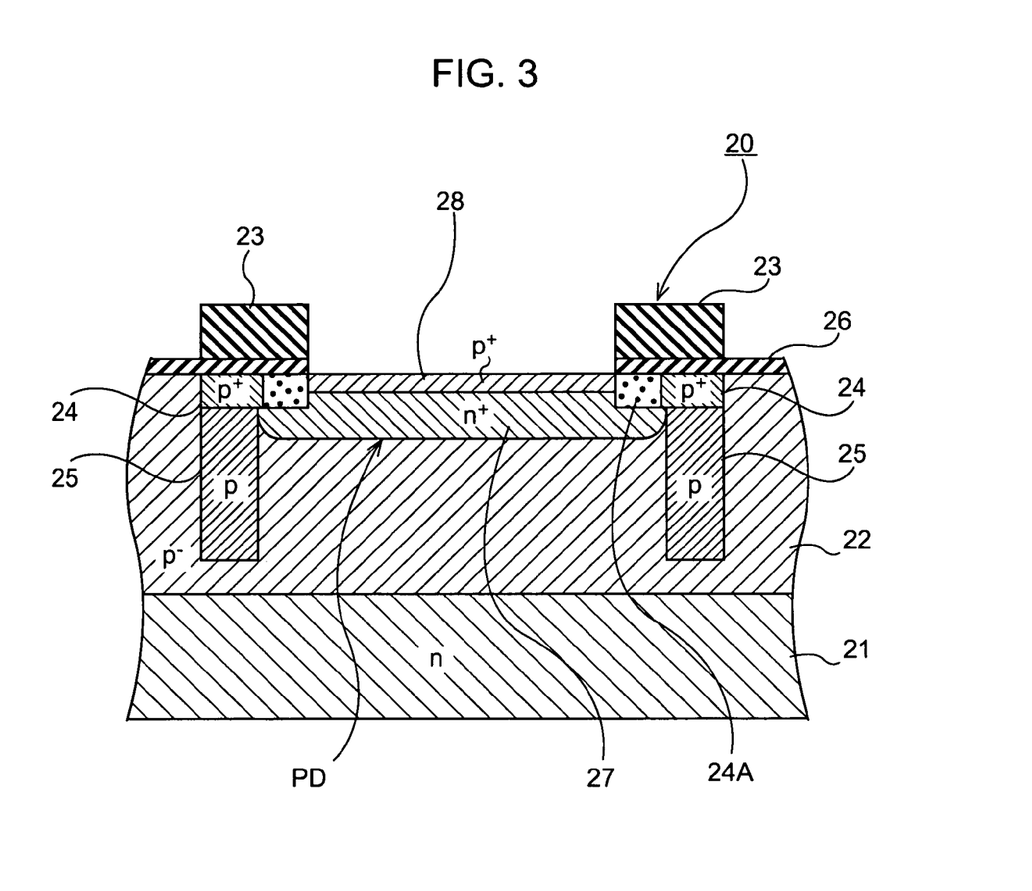
FIG. 3 is a view showing the structure of the relevant part in the process for producing the solid-state image pickup device according to the first embodiment of the present invention.

FIGS. 1 to 3 are views showing the structure of the relevant part in a process for producing a solid-state image pickup device according to a first embodiment of the present invention.

A solid-state image pickup device 20 according to the first embodiment includes a first conductivity type semiconductor substrate, for example, an n-type silicon substrate 21. A second conductivity type, for example, a p-type semiconductor well region 22 is disposed on the n-type silicon substrate 21. In the p-type semiconductor well region 22, a plurality of pixels 30 each including a photodiode PD serving as a photoelectric conversion part (the pixels 30 including transistors (not shown in the figures) for taking out signal charges accumulated in the photodiodes PDs) is disposed in a two-dimensional array. An element isolation insulating film 23 for electrically isolating adjacent unit pixels 30 from each other is disposed so as to face the surface of the p-type semiconductor well region 22. Furthermore, a p-type first isolation diffusion layer 24 for electrically isolating the adjacent unit pixels 30 from each other is disposed on the surface of the p-type semiconductor well region 22, the surface being disposed under the element isolation insulating film 23. Furthermore, a p-type second isolation diffusion layer 25 for electrically isolating the adjacent unit pixels 30 from each other is disposed under the first isolation diffusion layer 24 in the p-type semiconductor well region 22. An insulating film 26 is provided on the surface of the p-type semiconductor well region 22.

The photodiode PD is disposed in the p-type semiconductor well region 22 surrounded by the p-type semiconductor well region 22, the first isolation diffusion layers 24, and the second isolation diffusion layers 25 and includes a first conductivity type n-type charge accumulation region 27 that accumulates signal charges generated by photoelectric conversion. In the present embodiment, the photodiode PD further includes a second conductivity type p$^+$ accumulation layer 28 disposed on the surface of the n-type charge accumulation region 27. Such a photodiode PD forms an image sensor having a hole accumulation diode (HAD) structure.

In the photodiode PD, the p$^+$ accumulation layer 28 has a function of suppressing the cause of dark current and white spots due to the interface level. The first isolation diffusion layer 24 isolates adjacent photodiodes PDs more reliably. In addition, the second isolation diffusion layer 25 doubles as a function for isolating the adjacent photodiodes PDs in the depth direction.

A method for producing the solid-state image pickup device 20 will now be described with reference to FIGS. 1 to 3.

First, as shown in FIG. 1, the p-type semiconductor well region 22 is formed on the n-type silicon substrate 21. Subsequently, an isolation pattern for isolating the pixels 30 including the photodiodes PDs serving as the photoelectric conversion part from each other is patterned on the p-type semiconductor well region 22 by photolithography. The p-type second isolation diffusion layer 25 is then formed in the depth direction by implanting an impurity ion once or multiple times. In this case, the dosage during ion implantation is about $1 \times 10^{11}$ to $1 \times 10^{14}$ cm$^{-2}$. In addition, the second isolation diffusion layer 25 has a width d1 of about 0.05 to 10 μm. Thus, the width d1 of the second isolation diffusion layer 25 is set to the above dimension, and in addition, the line width d1 is decreased as much as possible, as long as the process can be performed. Thus, the width d1 is controlled to be smaller than the line width dimension d2 of the element isolation insulating film 23. Consequently, an extension region 29 for substantially extending the charge accumulation area of the n-type charge accumulation region 27 is formed in an area of the p-type semiconductor well region 22, the area being disposed under the element isolation insulating film 23 and inside the second isolation diffusion layer 25.

Subsequently, an element isolation pattern for isolating the pixels 30 including the photodiodes PDs serving as the photoelectric conversion part from each other is patterned on the surface of the p-type semiconductor well region 22 by photolithography. The p-type first isolation diffusion layer 24 is then formed by implanting an impurity ion directly on the second isolation diffusion layer 25. In this case, the dosage during ion implantation is about $1 \times 10^{11}$ to $1 \times 10^{14}$ cm$^{-2}$. In addition, the first isolation diffusion layer 24 is formed so that the width in the horizontal direction of the first isolation diffusion layer 24 is substantially the same as the line width d2 of the element isolation insulating film 23. Consequently, as shown in FIG. 2, the inner peripheral part of the first isolation diffusion layer 24 corresponding to the boundary between the charge accumulation region 27 and the first isolation diffusion layer 24 is projected in the charge accumulation region 27 to form a projecting region 24A.

Furthermore, an element-isolation pattern for isolating the pixels 30 including the photodiodes PDs from each other is patterned on the surface of the p-type semiconductor well region 22 by photolithography. The element isolation insulating film 23 composed of, for example, silicon oxide (SiO$_2$) is then formed on the first isolation diffusion layer 24 so as to overlap with each other. Subsequently, in the p-type semiconductor well region 22 surrounded by the first isolation diffusion layer 24 and the second isolation diffusion layer 25, and the projecting regions 24A of the first isolation diffusion layer 24, an impurity ion is implanted in a dosage of, for example, about $1 \times 10^{12}$ to $1 \times 10^{14}$ cm$^{-2}$ through an opening 23A formed in the element isolation insulating film 23 and the element isolation insulating film 23. Consequently, the n-type charge accumulation region 27 having an area corresponding to the opening 23A is formed, and at the same time, the projecting region 24A of the first isolation diffusion layer 24 becomes a state in which the impurity having a conductivity type of the first isolation diffusion layer 24, for example, a p-type impurity, and the impurity having a conductivity type of the charge accumulation region 27, for example, an n-type impurity are mixed. By forming the state in which the impurities are mixed in the projecting region 24A, the electric field of the junction between the n layer and the p layer in the vicinity of the charge accumulation region 27 is reduced. Subsequently, a p-type impurity ion with a high concentration of, for example, $5 \times 10^{17}$ cm$^3$ or more is implanted on the surface of the n-type charge accumulation region 27 and diffused to form the p$^+$ accumulation layer 28.

Subsequently, the solid-state image pickup device 20 having the structure shown in FIG. 2 is charged in a thermal diffusion furnace (not shown in the figure) and heated at a predetermined temperature, for example, under an atmosphere of 1,000° C. for a predetermined time, for example, 10 seconds. Thereby, the impurity of the n-type charge accumulation region 27 is thermally diffused in the p-type semiconductor well region 22. Consequently, as shown in FIG. 3, the n-type charge accumulation region 27 is extended in the depth direction of the photodiode PD and in the direction orthogonal to the depth direction, at least in the direction orthogonal to the depth direction of the photodiode PD. Thus, the n-type charge accumulation region 27 is formed so that the peripheral part of the n-type charge accumulation region 27 is abutted or disposed close to the second isolation diffusion layer 25 under the projecting region 24A. Here, the term "close to" means that the n-type charge accumulation region 27 extends toward the p-type second isolation diffusion layer 25 by at least half of the width of the extension region 29.

According to the solid-state image pickup device 20 of the first embodiment and the method for producing the same, in the step of forming the photodiode PD serving as the photoelectric conversion part, the charge accumulation region 27 of the photodiode PD is formed in the p-type semiconductor well region 22 surrounded by the first isolation diffusion layer 24 and the second isolation diffusion layer 25 by ion implantation, and in addition, the impurity ion is implanted in the projecting region 24A of the first isolation diffusion layer 24. By the subsequent thermal diffusion, the peripheral part of the n-type charge accumulation region 27 is abutted or disposed close to the second isolation diffusion layer 25 under the projecting region 24A. Therefore, the charge accumulation region 27 can be easily formed under the projecting region 24A of the first isolation diffusion layer 24. This structure can increase the charge accumulation region (area) of the photoelectric conversion part in the pixel to improve the photoelectric conversion efficiency of the unit pixel and increase the amount of saturation signal. Furthermore, unlike the known photoelectric transducer, the impurity concentration in the impurity region of a photoelectric transducer is not excessively increased, and therefore, the generation of defective pixels such as white spots can be suppressed. In addition, the projecting region 24A is formed in a state in which the impurity having the conductivity type of the first isolation diffusion layer 24 and the impurity having the conductivity type of the charge accumulation region 27 are mixed. Consequently, the electric field of the junction between the n layer in the charge accumulation region 27 and the p layer can be reduced. Thereby, the generation of electrons is suppressed, and thus the generation of dark current and white spots can be suppressed.

Second Embodiment

A solid-state image pickup device according to a second embodiment of the present invention and a method for producing the same will now be described with reference to FIGS. 4 to 6.

Figure 4:
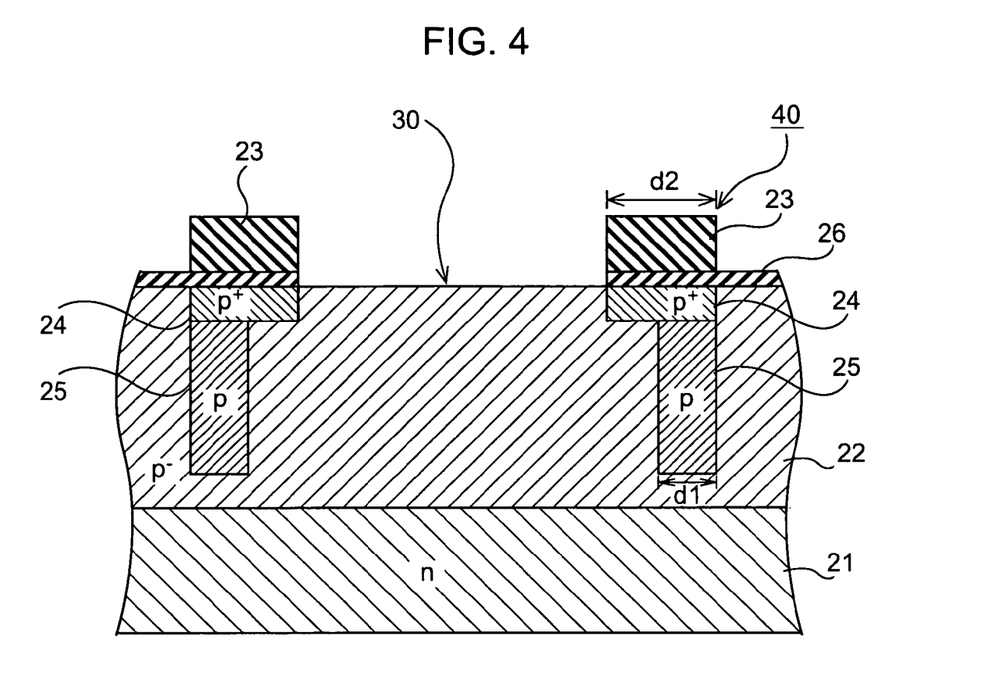
FIG. 4 is a view showing the structure of the relevant part in a process for producing a solid-state image pickup device according to a second embodiment of the present invention.
Figure 5:
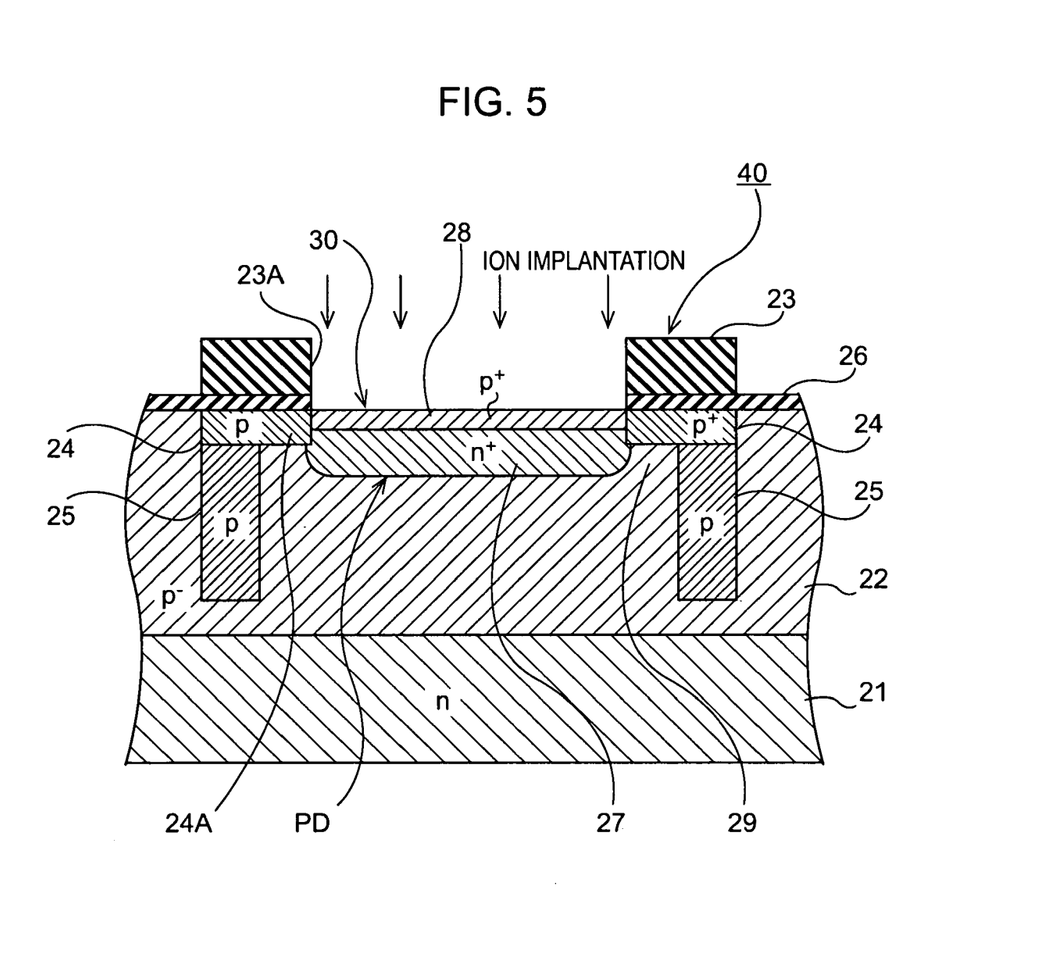
FIG. 5 is a view showing the structure of the relevant part in the process for producing the solid-state image pickup device according to the second embodiment of the present invention.
Figure 6:
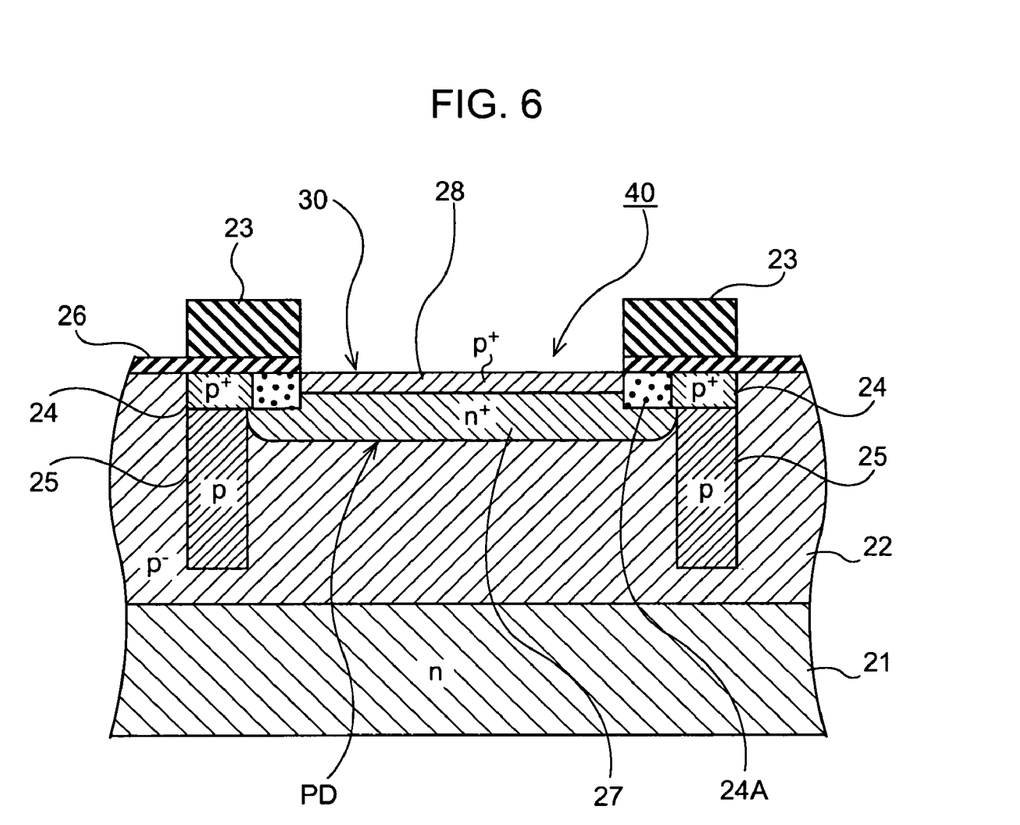
FIG. 6 is a view showing the structure of the relevant part in the process for producing the solid-state image pickup device according to the second embodiment of the present invention.

FIGS. 4 to 6 are views showing the structure of the relevant part in a process for producing the solid-state image pickup device according to the second embodiment of the present invention.

As in the case shown in Example 1, a solid-state image pickup device 40 according to the second embodiment also includes a first conductivity type semiconductor substrate, for example, an n-type silicon substrate 21. A second conductivity type, for example, a p-type semiconductor well region 22 is disposed on the n-type silicon substrate 21. In the p-type semiconductor well region 22, a plurality of pixels 30 each including a photodiode PD serving as a photoelectric conversion part is disposed in a two-dimensional array. An element isolation insulating film 23 for electrically isolating adjacent unit pixels 30 from each other is disposed so as to face the surface of the p-type semiconductor well region 22. Furthermore, a p-type first isolation diffusion layer 24 for electrically isolating the adjacent unit pixels 30 from each other is disposed on the surface of the p-type semiconductor well region 22, the surface being disposed under the element isolation insulating film 23. Furthermore, a p-type second isolation diffusion layer 25 for electrically isolating the adjacent unit pixels 30 from each other is disposed under the first isolation diffusion layer 24 in the p-type semiconductor well region 22. An insulating film 26 is provided on the surface of the p-type semiconductor well region 22.

The photodiode PD is disposed in the p-type semiconductor well region 22 surrounded by the p-type semiconductor well region 22, the first isolation diffusion layers 24, and the second isolation diffusion layers 25 and includes a first conductivity type n-type charge accumulation region 27 that accumulates signal charges generated by photoelectric conversion. The photodiode PD further includes a second conductivity type p$^+$ accumulation layer 28 disposed on the surface of the n-type charge accumulation region 27. Such a photodiode PD forms an image sensor having the HAD structure.

A method for producing the solid-state image pickup device 40 will now be described with reference to FIGS. 4 to 6.

First, as shown in FIG. 4, the p-type semiconductor well region 22 is formed on the n-type silicon substrate 21. Subsequently, an isolation pattern for isolating the pixels 30 including the photodiodes PDs serving as the photoelectric conversion part from each other is patterned on the p-type semiconductor well region 22 by photolithography. The p-type second isolation diffusion layer 25 is then formed in the depth direction by implanting an impurity ion once or multiple times. In this case, the dosage during ion implantation is about $1 \times 10^{11}$ to $1 \times 10^{14}$ cm$^{-2}$. The width d1 of the second isolation diffusion layer 25 is controlled to be smaller than the line width dimension d2 of the element isolation insulating film 23. Consequently, an extension region 29 for substantially extending the charge accumulation area of the n-type charge accumulation region 27 is formed in an area of the p-type semiconductor well region 22, the area being disposed under the first isolation diffusion layer 24 and inside the second isolation diffusion layer 25.

Subsequently, an element-isolation pattern for isolating the pixels 30 including the photodiodes PDs serving as the photoelectric conversion part from each other is patterned on the surface of the p-type semiconductor well region 22 by photolithography. The p-type first isolation diffusion layer 24 is then formed by implanting an impurity ion directly on the second isolation diffusion layer 25. In this case, the dosage during ion implantation is about $1 \times 10^{11}$ to $1 \times 10^{14}$ cm$^{-2}$. In addition, the first isolation diffusion layer 24 is formed so that the width in the horizontal direction of the first isolation diffusion layer 24 is substantially the same as the line width d2 of the element isolation insulating film 23. Consequently, as shown in FIG. 5, the inner peripheral part of the first isolation diffusion layer 24 corresponding to the boundary between the charge accumulation region 27 and the first isolation diffusion layer 24 forms a projecting region 24A projecting in the charge accumulation region 27 by a predetermined dimension.

Furthermore, an element-isolation pattern for isolating the pixels 30 including the photodiodes PDs from each other is patterned on the surface of the p-type semiconductor well region 22 by photolithography. The element isolation insulating film 23 composed of, for example, silicon oxide (SiO$_2$) is then formed on the first isolation diffusion layer 24 so as to overlap with each other. Subsequently, in the p-type semiconductor well region 22 surrounded by the first isolation diffusion layer 24 and the second isolation diffusion layer 25, an impurity ion is implanted in a dosage of, for example, about $1 \times 10^{12}$ to $1 \times 10^{14}$ cm$^{-2}$ through an opening 23A formed in the element isolation insulating film 23. Consequently, the n-type charge accumulation region 27 having an area corresponding to the opening 23A is formed. Subsequently, a p-type impurity ion with a high concentration of, for example, $5 \times 10^{17}$ cm$^3$ or more is implanted on the surface of the n-type charge accumulation region 27 and diffused to form the p$^+$ accumulation layer 28.

Subsequently, the solid-state image pickup device 40 having the structure shown in FIG. 5 is charged in a thermal diffusion furnace (not shown in the figure) and heated at a predetermined temperature, for example, under an atmosphere of 1,000° C. for a predetermined time, for example, 10 seconds. Thereby, the impurity of the n-type charge accumulation region 27 is thermally diffused, i.e., subjected to rapid thermal annealing (RTA), in the p-type semiconductor well region 22. Consequently, as shown in FIG. 6, the n-type charge accumulation region 27 is extended in the depth direction of the photodiode PD and in the direction orthogonal to the depth direction, at least in the direction orthogonal to the depth direction of the photodiode PD. Thus, the n-type charge accumulation region 27 is formed so that the peripheral part of the n-type charge accumulation region 27 is abutted or disposed close to the second isolation diffusion layer 25 under the projecting region 24A. At the same time, the impurity implanted in the n-type charge accumulation region 27 by ion implantation is also thermally diffused in the projecting region 24A of the first isolation diffusion layer 24. Consequently, the projecting region 24A becomes a state in which the impurity having a conductivity type of the first isolation diffusion layer 24, for example, a p-type impurity, and the impurity having a conductivity type of the charge accumulation region 27, for example, an n-type impurity are mixed. By forming the state in which the p-type impurity and the n-type impurity are mixed in the projecting region 24A, the electric field of the junction between the n layer and the p layer in the vicinity of the charge accumulation region 27 is reduced.

According to the solid-state image pickup device 40 of the second embodiment and the method for producing the same, in the step of forming the photodiode PD serving as the photoelectric conversion part, the charge accumulation region 27 of the photodiode PD is formed in the p-type semiconductor well region 22 surrounded by the first isolation diffusion layer 24 and the second isolation diffusion layer 25 by implanting an impurity ion. By the subsequent thermal diffusion, the peripheral part of the n-type charge accumulation region 27 is abutted or disposed close to the second isolation diffusion layer 25 under the projecting region 24A. Therefore, the charge accumulation region 27 can be easily formed under the projecting region 24A of the first isolation diffusion layer 24. This structure can increase the charge accumulation region (area) of the photoelectric conversion part in the pixel to improve the photoelectric conversion efficiency of the unit pixel and increase the amount of saturation signal. Furthermore, unlike the known photoelectric transducer, the impurity concentration in the impurity region of photoelectric transducer is not excessively increased, and therefore, the generation of defective pixels such as white spots can be suppressed. In addition, the impurity implanted in the n-type charge accumulation region 27 by ion implantation is also thermally diffused in the projecting region 24A. Thus, the projecting region 24A is in a state in which the impurity having the conductivity type of the first isolation diffusion layer 24 and the impurity having the conductivity type of the charge accumulation region 27 are mixed. Consequently, the electric field of the junction between the n layer in the charge accumulation region 27 and the p layer can be reduced. Thereby, the generation of electrons is suppressed, and thus the generation of dark current and white spots can be suppressed.

The first embodiment and the second embodiment describe the cases where the photodiode PD forms an image sensor having the HAD structure in which the p$^+$ accumulation layer 28 is laminated on the n-type charge accumulation region 27. However, the present invention is not limited thereto and the photodiode PD may have a structure, for example, that does not include the p$^+$ accumulation layer 28.

The present invention is not limited to the above embodiments. In the specific structures, functions, operations, and advantages, the present invention may be embodied by other various modifications without departing from the spirit and the scope thereof. In the above embodiments, examples in which the present invention is mainly applied to a CMOS image sensor have been described. However, when the present invention is applied to other image pickup devices such as a CCD image pickup device, the same advantages can be achieved.

What is claimed is:

1. A solid-state image pickup device in which a plurality of pixels including a photoelectric conversion part having a charge accumulation region accumulating signal charges is two-dimensionally arrayed in a well region provided on a semiconductor substrate, the solid-state image pickup device comprising:
    an element isolation insulating film that electrically isolates the pixels on the surface of the well region;
    a first isolation diffusion layer that electrically isolates the pixels under the element isolation insulating film; and
    a second isolation diffusion layer that electrically isolates the pixels under the first isolation diffusion layer,
    wherein the charge accumulation region is disposed in the well region surrounded by the first isolation diffusion layer and the second isolation diffusion layer,
    the inner peripheral part of the first isolation diffusion layer corresponding to the boundary between the charge accumulation region and the first isolation diffusion layer forms a projecting region projecting in the charge accumulation region,
    an impurity having a conductivity type of the first isolation diffusion layer and an impurity having a conductivity type of the charge accumulation region are mixed in the projecting region, and
    a part of the charge accumulation region corresponding to the boundary between the charge accumulation region and the second isolation diffusion layer is disposed under the projecting region and is abutted or disposed close to the second isolation diffusion layer.

2. The solid-state image pickup device according to claim 1, wherein the second isolation diffusion layer is disposed so as to extend in the depth direction of the well region.

3. The solid-state image pickup device according to claim 1, wherein the photoelectric conversion part comprises a hole accumulation layer laminated on the charge accumulation region.

* * * * *